(12) United States Patent
Yang

(10) Patent No.: US 8,942,044 B2
(45) Date of Patent: Jan. 27, 2015

(54) FLASH MEMORY DEVICE

(75) Inventor: Guangjun Yang, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 404 days.

(21) Appl. No.: 13/570,791

(22) Filed: Aug. 9, 2012

(65) Prior Publication Data

US 2013/0077406 A1 Mar. 28, 2013

(30) Foreign Application Priority Data

Sep. 28, 2011 (CN) .......................... 2011 1 0300758

(51) Int. Cl.
| | | |
|---|---|---|
| *G11C 16/24* | (2006.01) | |
| *G11C 16/04* | (2006.01) | |
| *G11C 16/34* | (2006.01) | |

(52) U.S. Cl.
CPC ............ *G11C 16/24* (2013.01); *G11C 16/0425* (2013.01); *G11C 16/3418* (2013.01)
USPC ................................. 365/185.18; 365/185.25

(58) Field of Classification Search
CPC . G11C 16/24; G11C 16/3418; G11C 16/0425
USPC ....................................... 365/185.18, 185.25
See application file for complete search history.

(56) References Cited

U.S. PATENT DOCUMENTS

| | | | | |
|---|---|---|---|---|
| 6,400,607 | B1 * | 6/2002 | Pasotti et al. ............ | 365/185.21 |
| 6,856,551 | B2 * | 2/2005 | Mokhlesi et al. ........ | 365/185.28 |
| 7,085,157 | B2 * | 8/2006 | Tanaka et al. ............ | 365/185.02 |
| 7,161,844 | B2 * | 1/2007 | Sarin et al. ............... | 365/189.03 |
| 2007/0285990 | A1 * | 12/2007 | Lee .......................... | 365/185.25 |

FOREIGN PATENT DOCUMENTS

CN 102184745 A * 9/2011

* cited by examiner

*Primary Examiner* — Harry W Byrne
*Assistant Examiner* — Lance Reidlinger
(74) *Attorney, Agent, or Firm* — Harness, Dickey & Pierce, P.L.C.

(57) ABSTRACT

A flash memory device is provided. The flash memory device includes a memory cell array and a pre-charge unit. The pre-charge unit, coupled to a plurality of bit lines corresponding with the memory cell array, pre-charges the bit lines to a predetermined voltage during a pre-charge stage. The pre-charge unit includes a voltage stabilizing unit to provide a constant current to the bit lines. Due to the voltage stabilizing unit, in a programming process, the voltage applied to the bit lines which are not related with programming may not drop as a result of current leakage. Therefore, the memory cells except the memory cell to be programmed are kept in cut off state, without a current passing. As a result, interference with the memory cells which are not to be programmed may be effectively avoided and the accuracy of programming may be improved.

6 Claims, 4 Drawing Sheets

FLASH MEMORY DEVICE

The present application claims priority to Chinese Patent Application No. 201110300758.3, filed on Sep. 28, 2011 and entitled "FLASH MEMORY DEVICE", the entire disclosure of which is incorporated herein by reference in its entirety.

FIELD OF THE INVENTION

The present disclosure generally relates to a semiconductor memory device, and more particularly, to a flash memory device.

BACKGROUND OF THE INVENTION

Memory devices are utilized for storage of mass data information. Currently, a variety of memory devices have been developed, for example, random access memory (RAM), dynamic random access memory (DRAM), erasable programmable read only memory (EPROM), flash memory, and the like, among which, flash memory are mainstream of non-volatile semiconductor memories. Currently, according to structures of memory cells, flash memory are classified into stack-gate flash memory and split-gate flash memory, wherein the split-gate memory devices are widely used because of its high programming efficiency without over erasing problem.

However, conventional flash memory devices suffer from wrongly programming due to leakage current on bit lines.

Therefore, there is a need to provide a flash memory device in which programming of certain memory cells may not induce other memory cells to be programmed.

BRIEF SUMMARY OF THE INVENTION

According to an embodiment of the present disclosure, a flash memory device is provided. The flash memory device includes: a memory cell array including a plurality of memory cells; and a pre-charge unit, the pre-charge unit being coupled to a plurality of bit lines corresponding to the memory cells and pre-charging the plurality of bit lines to a predetermined voltage during a pre-charge stage, wherein the pre-charge unit includes a voltage stabilizing unit which provides a substantially stable current to each of the bit lines. The pre-charge unit further includes: a bias unit; and a plurality of adjusting transistors, each of which being coupled to a corresponding bit line; wherein each of the adjusting transistors includes a first end coupled to the voltage stabilizing unit, a second end coupled to a corresponding bit line and a control end coupled to the bias unit, and the bias unit is adapted for providing a bias voltage necessary to turn on the adjusting transistors. The voltage stabilizing unit includes a minor unit and a current source; wherein the minor unit includes an input PMOS transistor, and a plurality of minor PMOS transistors each of which corresponds to one of the adjusting transistors; wherein the input PMOS transistor includes a source coupled to a power supply, a drain and a gate which are coupled to each other and coupled to the current source; and wherein each of the mirror PMOS transistors includes a source coupled to the power supply, a gate coupled to the gate of the input PMOS transistor and a drain coupled to the first end of a corresponding adjusting transistor.

Optionally, the current source provides a current ranging from about 1 μA to about 5 μA.

Optionally, the bias unit includes a first PMOS transistor, a comparator and a divider, wherein the comparator includes an in-phase input end coupled to an output end of the divider and an anti-phase input end coupled to a reference voltage, and wherein the first PMOS transistor includes a source coupled to a power supply, a gate coupled to an output end of the comparator, and a drain which is coupled to an input end of the divider and acts as an output end of the bias unit.

Optionally, the bias unit further includes a first NMOS transistor, wherein the first NMOS transistor includes a source coupled to the input end of the comparator, a gate and a drain coupled to each other and coupled to the drain of the first PMOS transistor.

Optionally, the divider includes a first resistance and a second resistance, wherein the first resistance includes a first end which is coupled to the drain of the first PMOS transistor and acts as the input end of the divider, a second end coupled to a first end of the second resistance, and wherein the second resistance includes a second end which is grounded and a first end which is coupled to the in-phase input end of the comparator and acts as the output end of the divider.

Optionally, the flash memory device is a split-gate memory device.

Compared with the prior art, the embodiments of the present disclosure have advantages below:

Due to the voltage stabilizing unit, in a programming process, the voltage applied to the bit lines which are not related with programming may not drop as a result of current leakage. Therefore, the memory cells except the memory cell to be programmed are kept in cut off state, without a current passing. As a result, interference with the memory cells which are not to be programmed may be effectively avoided and the accuracy of programming may be improved.

Furthermore, in an alternative embodiment, the bias unit can precisely control the voltage applied to the bit lines, which lead to a more accurate programming.

DETAILED DESCRIPTION OF THE INVENTION

Figure 1:
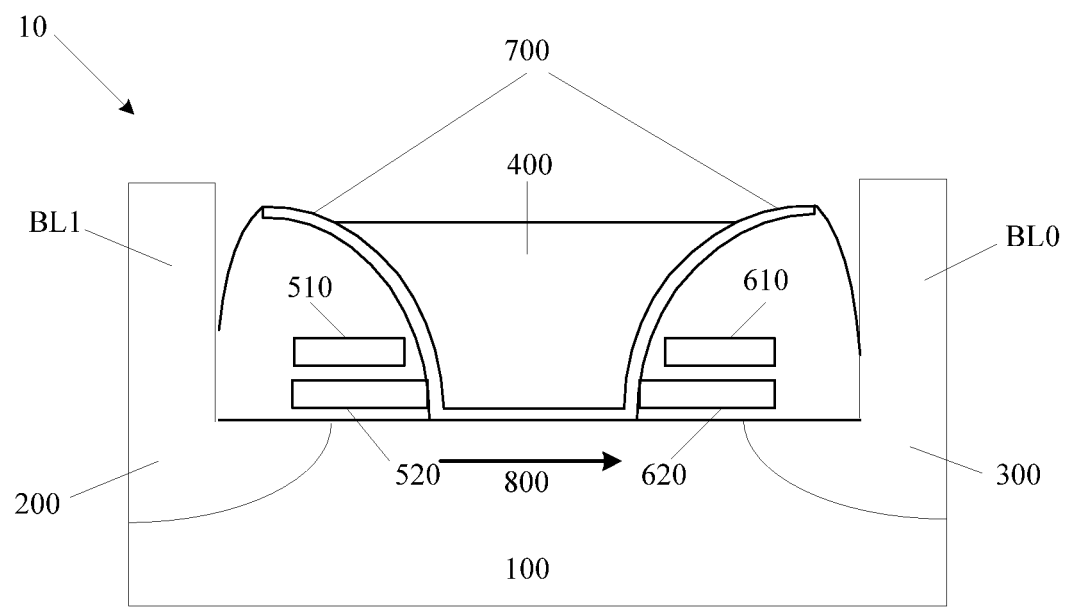
FIG. 1 is a schematic cross-sectional view of a conventional split-gate memory cell.
Figure 2:
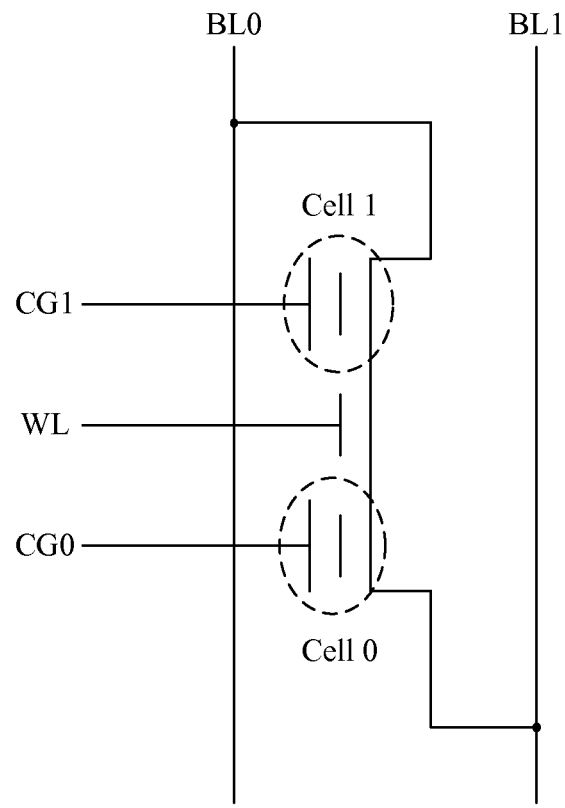
FIG. 2 is an equivalent circuit structure of the split-gate memory cell as shown in FIG. 1.

FIG. 1 is a schematic cross-sectional view of a conventional split-gate memory cell. FIG. 2 is an equivalent circuit structure of the split-gate memory cell as shown in FIG. 1. Referring to FIGS. 1 and 2, a memory cell 10 includes: a substrate 100; a source region 200 and a drain region 300 configured in the substrate; a channel region 800 between the source region 200 and the drain region 300; a first floating gate 520 and a first control gate 510 (shown as "CG0" in FIG. 2) on the substrate, a second floating gate 620 and a second control gate 610 (shown as "CG1" in FIG. 2) on the substrate; an oxide layer 700 insulating the first floating gate 520 and the second floating gate 620; and a selection gate 400 on the oxide layer 700. The source region 200 and the drain region 300 are respectively coupled to bit lines BL1 and BL0.

Referring still to FIGS. 1 and 2, the memory cell 10 includes two sub-memory cells "cell 0" and "cell 1" respectively corresponding to the two floating gates. Data of the cell 0 are stored in the first floating gate 520 and data of the cell 1 are stored in the second floating gate 620. Programming operation to the cell 1 are described hereinafter for illustration purposes. A word line voltage $V_W$ in a range of, for example, 1 V to 2V, is applied to a word line WL coupled to the selection gate 400. A source current Idp in a range of, for example, 0.5 uA to 5 uA is applied to the bit line BL1 coupled to the source region 200, to form a voltage Vs in a range of 0.1 V to 0.6 V. A drain voltage $V_D$ in a range of, for example, 2.5 V to 5.5 V, is applied to the bit line BL0 coupled to the drain region 300. A programming voltage $V_{PROG}$ in a range of, for example, 5 V to 9 V, is applied to the second control gate 610 (shown as CG1 in FIG. 2). For the cell 0 which is not to be programmed, a voltage $V_{PASS}$ in a range of, for example, 2 V to 6V, is applied to the first control gate 510 (shown as CG0 in FIG. 2). By doing this, a required current for the programming process may be maintained in the channel region 800, so that hot electrons are injected into the second floating gate 620 to perform programming.

It can be concluded that, to program a memory cell, two requirements should be met: the voltage difference between the $V_W$ which is applied to the memory cell's selection gate and the $V_S$ should be larger than the threshold voltage of the memory cell to guarantee the source current Idp flowing; and the voltage difference between the $V_D$ applied to the memory cell's drain and the $V_S$ should be large enough to maintain the required current for the programming process.

Figure 3:
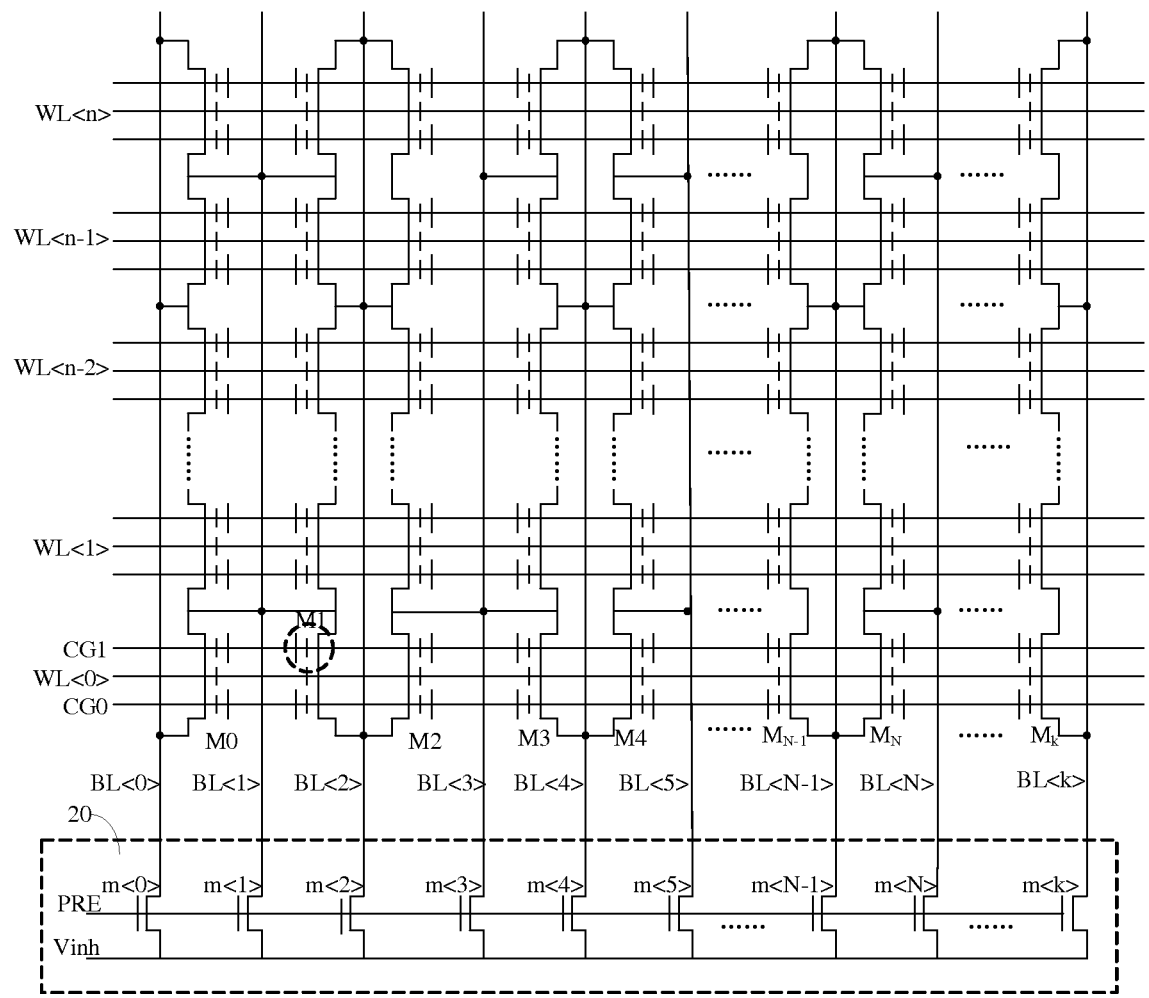
FIG. 3 is a schematic view of a conventional split-gate memory device.

FIG. 3 illustrates a conventional split-gate memory device. As shown in FIG. 3, the memory device includes: a pre-charge unit 20 and a memory cell array including a plurality of memory cells. A plurality of word lines (WL<0> to WL<k>) and a plurality of bit lines (BL<0> to BL<k>) are configured in the array. Each of the memory cells is a split-gate memory cell as shown in FIG. 1, including a selection gate coupled to a corresponding word line, a source coupled to a correspond bit line and a drain coupled to another correspond bit line.

In the conventional art, when programming a target memory cell, for example, M1 in FIG. 3, a word line voltage $V_W$ is applied to the word line WL<0> to provide $V_W$ to M1's selection gate. A current Idp is applied to the bit line BL<2> to provide $V_S$ to M1's source and a voltage $V_D$ is applied to the bit line BL<1> to provide $V_D$ to M1's drain. The voltage difference between $V_W$ and $V_S$ is larger than the threshold voltage of M1, and the voltage difference between $V_D$ and $V_S$ is large enough for programming M1.

However, when applying $V_W$ on WL<0>, the voltage is applied to the selection gates of each memory cell (M0 to $M_K$) in the same row. Referring to M0, M0 has a selection gate applied with $V_W$ and a drain coupled to BL<1> applied with $V_D$, therefore, a voltage should be applied to BL<0> coupled to M0's source to avoid undesirable programming of M0. Besides, referring to M2, M2 has one end (either source or drain) coupled to BL<2> on which $V_S$ is applied and another end coupled to BL<3>. Conventionally, to avoid undesirable programming of M2, a voltage, normally equals to $V_S$, is applied to BL<3>. Similar wrong operations may occur when programming other memory cells. Therefore, the pre-charge unit 20 is configured to apply a predetermined voltage to the bit lines before programming a certain memory cell. For example, the pre-charge unit 20 includes a plurality of adjusting transistors (m<0> to m<k>) respectively coupled to the corresponding bit lines to provide required operation voltage. Specifically, when a pre-charge control signal is on high level, the adjusting transistors are turned on and the bit lines are pre-charged to a predetermined voltage $V_{inh}$. When the control signal is on low level, the adjusting transistors are turned off, so the bit lines are "floated". The term "floated" means that the bit lines are configured under a circumstance that the predetermined voltages applied thereon are still maintained when the adjusting transistors are turned off, however, the voltages on certain bit lines may be altered to realize programming these memory cells.

Nevertheless, incorrect programming still occurs due to the leakage current on the bit lines. For example, the predetermined voltage $V_{inh}$ applied to BL<0> may degrade due to the leakage current. When the voltage difference between $V_W$ (applied to WL<0> coupled to the selection gate of M0) and the voltage on BL<0> is equal to or larger than the threshold voltage of M0, and the voltage difference between $V_D$ (applied to BL<1> coupled to the drain of M0) and the voltage on BL<O> is large enough to maintain the programming process, M0 is undesirably programmed. However, if the bit lines are pre-charged with a higher predetermined voltage $V_{inh}$ to avoid undesirable programming of M0, M3 may be undesirably programmed. That is because the voltage difference between the higher $V_{inh}$ applied to BL<4> and $V_S$ applied to BL<3> may be large enough to maintain the programming process.

As described above, in the conventional memory device, the predetermined voltage pre-charged to the bit lines may drop due to the leakage current. Therefore, when a certain memory cell is being programmed, other adjacent memory cells may be undesirably programmed. In order to solve the problem, in a memory device provided by an embodiment of the present disclosure, a voltage stabilizing circuit is added, which provides a constant current to each of the bit lines so as to maintain the voltage applied thereon at the predetermined voltage. Therefore, the voltage drop caused by the leakage current may be avoided and the undesirable programming of adjacent memory cells may be avoided.

In order to clarify the objects, characteristics and advantages of the disclosure, embodiments of the disclosure will be interpreted in detail in combination with accompanied drawings.

Figure 4:
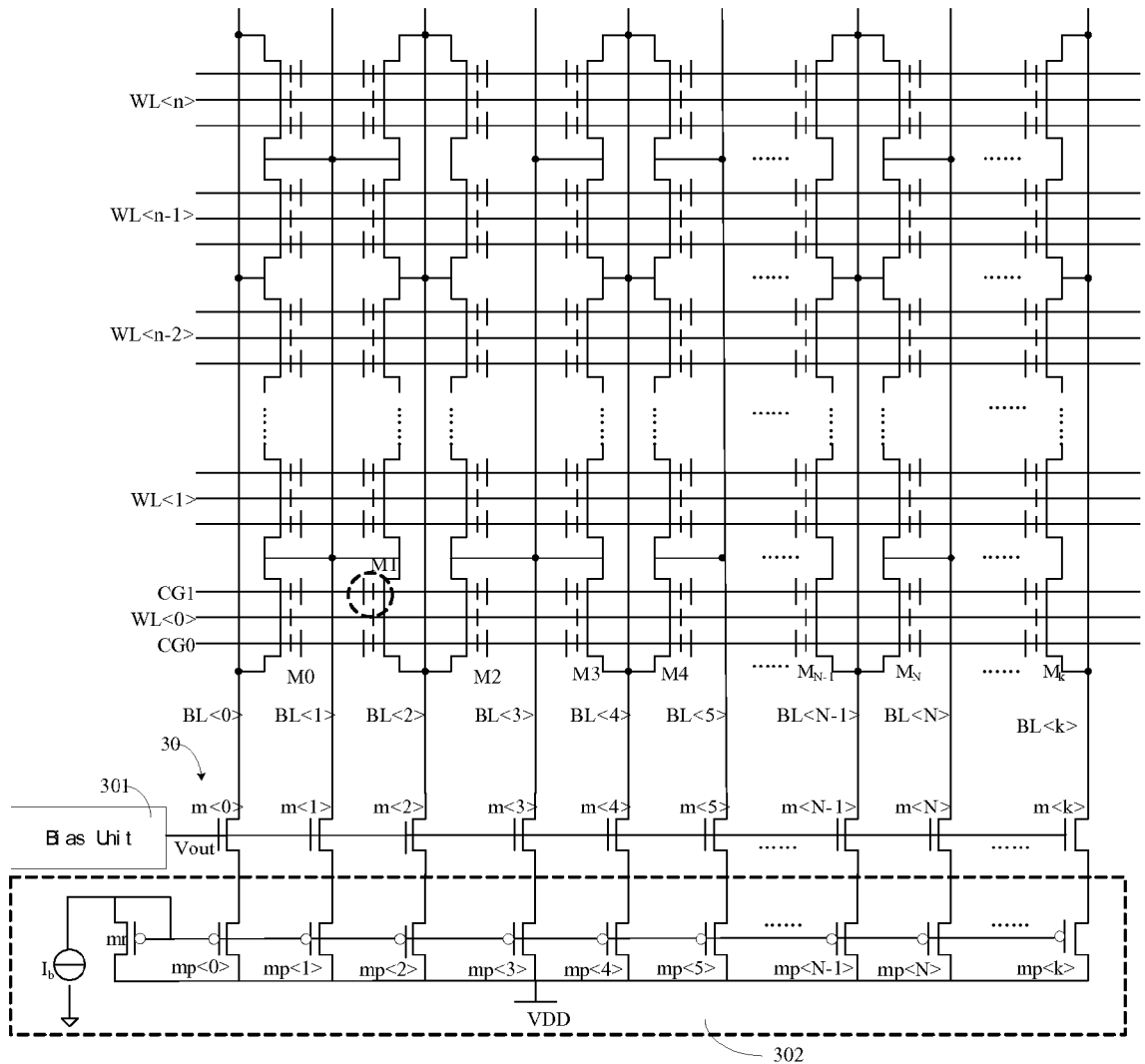
FIG. 4 is a schematic view of a memory device according to an embodiment of the present disclosure.

FIG. 4 is a schematic view of a memory device according to an embodiment of the present disclosure. Referring to FIG. 4, the memory device includes: a pre-charge unit 30 and a memory cell array including a plurality of memory cells.

Each of the memory cells is a split-gate memory cell which may store two independent bits.

The pre-charge unit 30 includes: a bias unit 301, a voltage stabilizing unit 302 and a plurality of adjusting transistors (m<0> to m<k>) corresponding to bit lines (BL<0> to BL<k>).

Specifically, each of the adjusting transistors (m<0> to m<k>) includes a first end coupled to the voltage stabilizing unit 302, a second end coupled to a corresponding bit line and a control end coupled to the bias unit 301. In an embodiment, the adjusting transistors (m<0> to m<k>) are all NMOS transistors.

The bias unit 301 provides a bias voltage to turn on the adjusting transistors (m<0> to m<k>), so that the voltage applied to the bit lines may be precisely controlled.

The voltage stabilizing unit 302 includes a mirror unit and a current source $I_b$. The minor unit includes an input PMOS transistor mr and a plurality of mirror PMOS transistors (mp<0> to mp<k>) each of which corresponds to an adjusting transistor (m<0> to m<k>). The input PMOS transistor mr includes a source coupled to a power supply VDD, a drain and a gate which are coupled to each other and coupled to the current source $I_b$. Each of the mirror PMOS transistors (mp<0> to mp<k>) includes a source coupled to the power supply VDD, a gate coupled to the gate of the input PMOS transistor mr and a drain coupled to the first end of a corresponding adjusting transistor.

During a programming process performed to the memory device, the minor unit of the voltage stabilizing unit 302 mirrors the current provided by the current source $I_b$ and thus obtains a mirror current. The minor current passes through each of the adjusting transistors (m<0> to m<k>) and then stabilizes the voltage on each bit line to a predetermined voltage $V_{inh}$. In a specific embodiment, the current source $I_b$ provides a current ranging from about 1 μA to about 5 μA, and the power supply VDD provides a voltage ranging from about 2.7 V to about 3.6 V.

Figure 5:
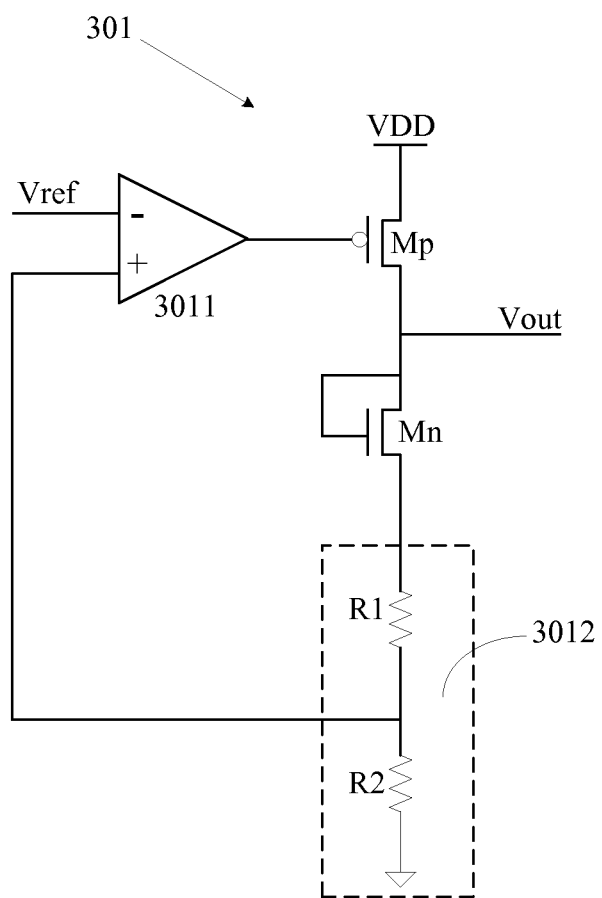
FIG. 5 is a schematic structural view of a bias unit in FIG. 4.

The bias unit 301 may be configured to have multiple different structures. FIG. 5 is a schematic structural view of a bias unit in FIG. 4. As shown in FIG. 5, the bias unit 301 includes a first PMOS transistor Mp, a first NMOS transistor Mn, a comparator 3011 and a divider 3012. The first PMOS transistor Mp includes a source coupled to a power supply VDD, a gate coupled to an input end of the comparator 3011 and a drain coupled to a drain of the first NMOS transistor Mn. The first NMOS transistor Mn includes a gate coupled to its drain, and a source coupled to an output end of the divider 3012. The comparator 3011 includes an in-phase input end coupled to an output end of the divider 3012, and an anti-phase input end coupled to a reference voltage $V_{ref}$. The divider 3012 includes a first resistance R1 and a second resistance R2. The first resistance R1 includes a first end which is coupled to the source of the first NMOS transistor Mn and acts as an input end of the divider 3012, and a second end coupled to a first end of the second resistance R2. The second resistance R2 further includes a second end which is grounded. The first end of the second resistance R2 is coupled to the in-phase input end of the comparator 3011 and acts as an output end of the divider 3012. In other exemplary embodiments, the bias unit 301 may not include the first NMOS transistor Mn, and the drain of the first PMOS transistor Mp may be directed coupled to the output end of the divider 3012. Those skilled in the art can make variation about the bias unit and/or the divider. Therefore, the exemplary structure illustrated in FIG. 5 should not unduly limit the scope of the present disclosure.

During the process of pre-charging the bit lines of the memory device, at the beginning, the first PMOS transistor Mp is cut off, so the divider 3012 output a voltage smaller than the reference voltage $V_{ref}$ on the anti-phase input end of the comparator 3011. Thus, a voltage difference between a voltage outputted by the comparator 3011 and a voltage of the power supply VDD is larger than a threshold voltage of the first PMOS transistor Mp. Therefore, the first PMOS transistor Mp and the first NMOS transistor Mn are turned on and the bias unit 301 outputs a voltage $V_{out}$ at a high level to turn on the adjusting transistors (m<0> to m<k>) shown in FIG. 4, thereby pre-charging the bit lines (BL<0> to BL<k>). When the bit lines (BL<0> to BL<k>) are pre-charged to a predetermined voltage, for example, $V_{inh}$, the divider 3012 outputs a voltage larger than the reference voltage $V_{ref}$. Thus, the voltage difference between the voltage outputted by the comparator 3011 and the voltage of the power supply VDD is smaller than the threshold voltage of the first PMOS transistor Mp. Thus, the first PMOS transistor is turned off, which render the voltage outputted by the bias unit 301 to drop. Meanwhile, the adjusting transistors (m<0> to m<k>) shown in FIG. 4 are turned into a "weak turn on state" and a constant current is provided by the voltage stabilizing unit 302 to each of the bit lines (BL<0> to BL<k>) to compensate the leakage current. Because the voltage applied to the adjusting transistors' sources (which are coupled to the bit lines) equal to the voltage applied to the adjusting transistors' gates minus the threshold voltage thereof, and the voltage applied to the adjusting transistors' gates equal to $V_{out}$, the voltage on the bit lines can be controlled by adjusting $V_{out}$. It should be noted that, the voltage $V_{out}$ outputted by the bias unit 301 can be controlled by adjusting the reference voltage $V_{ref}$ on the anti-phase input end of the comparator 3011, the first resistance R1 and the second resistance R2 of the divider 3012. Therefore, precise controlling of the pre-charged voltage applied to the bit lines (BL<0> to BL<k>) is realizable.

The programming process of the memory device provided by the embodiment of the present disclosure will be interpreted in detail in combination with accompanied drawings hereinafter.

Referring to FIG. 4, to perform a programming operation to a target memory cell M1 in FIG. 4, a word line voltage $V_W$ is applied to a word line WL<0> to select the target memory cell M1. The word line voltage $V_W$ ranges from about 1 V to about 2 V.

A first voltage $V_D$ is applied to the bit line BL<1>, which ranges from about 2.5 V to about 5.5 V.

A current Idp which is in the range of 0.5 uA to 5 uA is applied to the bit line BL<2>, generating a voltage Vs on the BL<2> which ranges from 0.1 V to about 0.6 V. The same voltage following Vs is supplied to BL<3> by a voltage follower.

As the bit lines BL<2> and BL<3> are applied with the same voltage $V_S$, the voltage applied to the memory cell M2's source equals to the voltage applied to its drain. Therefore, there is no current passing through the memory cell M2, and no leakage current occurs because the current on the bit line BL<2> completely flows through the target memory cell M1 which is to be programmed.

In an embodiment, a third voltage $V_{D2}$ is applied to the bit line BL<4>, which ranges from about 0.8 V to about 2 V.

Thus, the voltage applied to the memory cell M3's selection gate (i.e., the voltage applied to the word line WL<0>) ranges from about 1 V to about 2 V, the voltage applied to the memory cell M3's source (i.e., the voltage applied to the bit line BL<3>) ranges from about 0.1 V to about 0.6 V and the voltage applied to the memory cell M3's drain (i.e., the voltage applied to the bit line BL<4>) ranges from about 0.8 V to about 2 V. The voltage difference between the source and the drain of the memory cell M3 is far below the voltage which is necessary for programming. Therefore, the memory cell M3 may not be interfered.

Referring to other bit lines except BL<1>, BL<2>, BL<3> and BL<4>, the predetermined voltage $V_{inh}$ is pre-charged thereto by the pre-charge unit 30 and stabilized by providing the constant current from the voltage stabilizing unit 302. To avoid undesired programming processes, the voltage difference between the word line voltage applied to the word line and the predetermined voltage $V_{inh}$ should be smaller than the threshold voltage of the memory cells. Specifically, during the programming process of the memory device, the minor unit of the voltage stabilizing unit 302 mirrors the current provided by the current source $I_b$ and thus obtains the mirror current. The mirror current flows through each of the adjusting transistors (m<0> to m<k>) and then stabilizes the voltage on each of the bit lines (BL<0> to BL<k>) at the predetermined voltage $V_{inh}$.

Thus, the memory cell M0 in the same row as and neighboring the target memory cell M1 is configured at a cut off state because the voltage difference between its selection gate and source (i.e., the voltage difference between the word line WL<0> and the bit line BL<0>) is smaller than its threshold voltage. The memory cell M0 is not interfered because no current may flow therein.

A split-gate memory device is interpreted in detail above. However, it should be noted, the pre-charge unit provided by the embodiments may also be utilized in non-split-gate memory devices. In other embodiments, the pre-charge unit and the voltage stabilizing unit thereof function similarly as described above and thus will not be illustrated here.

In conclusion, the memory device provided by the embodiments of the present disclosure has advantages below.

The source and the drain of the memory cell M2 neighboring the target memory cell M1 to be programmed are applied with the same voltage level, which avoids the leakage current. Further, due to the adding of the voltage stabilizing unit, the voltage drop applied to other bit lines which are not related to the programming process may not drop even when the leakage current occurs. In addition, the voltage on the bit lines may be precisely adjusted by adjusting the bias unit, so that all the memory cells except the target memory cell are turned off during the programming process, without a current flowing through. As a result, interference with the memory cells which are not to be programmed may be effectively avoided and the accuracy of programming may be improved.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

The invention claimed is:

1. A flash memory device, comprising:
a memory cell array comprising a plurality of memory cells; and
a pre-charge unit, coupled to a plurality of bit lines corresponding to the memory cells, adapted for pre-charging the plurality of bit lines to a predetermined voltage during a pre-charge stage, and comprising a voltage stabilizing unit, a bias unit and a plurality of adjusting transistors,
wherein the voltage stabilizing unit provides a substantially stable current to each of the bit lines, and comprises a mirror unit and a current source,
wherein each of the adjusting transistors is coupled to a corresponding bit line, and each of the adjusting transistors comprises a first end coupled to the voltage stabilizing unit, a second end coupled to a corresponding bit line and a control end coupled to the bias unit, and the bias unit is adapted for providing a bias voltage necessary to turn on the adjusting transistors,
wherein the mirror unit comprises an input PMOS transistor, and a plurality of mirror PMOS transistors each of which corresponds to one of the adjusting transistors,
wherein the input PMOS transistor comprises a source coupled to a power supply, a drain and a gate which are coupled to each other and coupled to the current source; and
wherein each of the mirror PMOS transistors comprises a source coupled to the power supply, a gate coupled to the gate of the input PMOS transistor and a drain coupled to the first end of a corresponding adjusting transistor.

2. The flash memory device according to claim 1, wherein the current source provides a current ranging from about 1 μA to about 5 μA.

3. The flash memory device according to claim 1, wherein the bias unit comprises a first PMOS transistor, a comparator and a divider,
wherein the comparator comprises an in-phase input end coupled to an output end of the divider and an anti-phase input end coupled to a reference voltage, and
wherein the first PMOS transistor comprises a source coupled to a power supply, a gate coupled to an output end of the comparator, and a drain which is coupled to an input end of the divider and acts as an output end of the bias unit.

4. The flash memory device according to claim 3, wherein the bias unit further comprises a first NMOS transistor, wherein the first NMOS transistor comprises a source coupled to the input end of the comparator, a gate and a drain coupled to each other and coupled to the drain of the first PMOS transistor.

5. The flash memory device according to claim 3, wherein the divider comprises a first resistance and a second resistance, wherein the first resistance comprises a first end which is coupled to the drain of the first PMOS transistor and acts as the input end of the divider, a second end coupled to a first end of the second resistance, and wherein the second resistance comprises a second end which is grounded and a first end which is coupled to the in-phase input end of the comparator and acts as the output end of the divider.

6. The flash memory device according to claim 1, wherein the flash memory device is a split-gate memory device.

* * * * *

UNITED STATES PATENT AND TRADEMARK OFFICE
CERTIFICATE OF CORRECTION

PATENT NO. : 8,942,044 B2
APPLICATION NO. : 13/570791
DATED : January 27, 2015
INVENTOR(S) : Guangjun Yang It is certified that error appears in the above-identified patent and that said Letters Patent is hereby corrected as shown below:

On the Title page, item 73, Assignee    Delete "Grace Semiconductor Manufacturing Corporation" and insert --Shanghai Huahong Grace Semiconductor Manufacturing Corporation--.

Signed and Sealed this
Twenty-seventh Day of October, 2015

Michelle K. Lee
*Director of the United States Patent and Trademark Office*